United States Patent [19]
Kim

[11] Patent Number: 5,927,308
[45] Date of Patent: Jul. 27, 1999

[54] MEGASONIC CLEANING SYSTEM

[75] Inventor: Byeong-Soo Kim, Seoul, Rep. of Korea

[73] Assignee: Samsung Electronics Co., Ltd., Suwon, Rep. of Korea

[21] Appl. No.: 09/160,321

[22] Filed: Sep. 25, 1998

[30]     Foreign Application Priority Data

Sep. 25, 1997  [KR]   Rep. of Korea ..................... 97-48825

[51] Int. Cl.⁶ ................................ B08B 3/10; B08B 3/12
[52] U.S. Cl. ........................ 134/172; 134/902; 134/144
[58] Field of Search ................................ 134/902, 157, 134/172, 184, 198, 176.1, 144, 21, 1.3, 37

[56]              References Cited

U.S. PATENT DOCUMENTS

| | | | |
|---|---|---|---|
| 2,950,725 | 8/1960 | Jacke et al. | |
| 3,066,686 | 12/1962 | O'Neill | |
| 3,937,236 | 2/1976 | Runnells | 134/184 |
| 4,710,233 | 12/1987 | Hohmann et al. | 134/1 |
| 4,763,677 | 8/1988 | Miller | 134/105 |
| 5,203,362 | 4/1993 | Shibata | 134/184 |
| 5,377,709 | 1/1995 | Shibano | 134/184 |
| 5,534,076 | 7/1996 | Bran | 134/1 |
| 5,555,902 | 9/1996 | Menon | 134/199 |
| 5,625,249 | 4/1997 | Grant | 310/334 |
| 5,711,327 | 1/1998 | Fields | 134/105 |
| 5,722,444 | 3/1998 | Prokopenko et al. | 134/184 |
| 5,794,299 | 4/1998 | Gocket et al. | 15/77 |
| 5,803,099 | 9/1998 | Sakuta et al. | 134/56 R |

OTHER PUBLICATIONS

Quan Qi et al., "Mechanisms of Removal of Micron–Sized Particles by High–Frequency Ultrasonic Waves," IEEE Transactions on Ultrasonics, Ferroelectrics, and Frequency Control, vol. 42, No. 4, Jul. 1995, pp. 619–629.

*Primary Examiner*—Jill Warden
*Assistant Examiner*—Paul J. Lee
*Attorney, Agent, or Firm*—Jones Volentine, LLP

[57]               ABSTRACT

A megasonic cleaning system includes a transducer on which a substrate to be cleaned is placed. An oscillating electrically energy source is coupled to the transducer for driving the transducer to produce acoustical energy at substantially megasonic frequencies to vibrate the substrate. A blower assembly is arranged over the substrate, and the blower assembly contains a hollow elongate member having a plurality of nozzles spaced along a length thereof. A drive mechanism is connected to the blower assembly such that the blower assembly is horizontally movable relative to the surface of the substrate. A source of cleaning fluid is in flow communication with the nozzles, and the nozzles are arranged such that a flow path of cleaning fluid through the nozzles is inclined toward an upper surface of the substrate to be cleaned. A vacuum source is in flow communication with the substrate for vacuum-adhering the substrate on the transducer via a vacuum force. The cleaning fluid flowing through the nozzles is directed toward the upper surface of the substrate to blow away particles on the upper surface of the substrate that are dislodged by the vibration of the substrate.

10 Claims, 1 Drawing Sheet

:::: {#col1}
MEGASONIC CLEANING SYSTEM

BACKGROUND OF THE INVENTION

1. Field of the Invention

The present invention relates to megasonic cleaning systems, and more particularly to a megasonic cleaning system for cleaning articles such as semiconductor wafers and photo masks used in semiconductor device fabricating processes.

2. Description of the Related Art

In general, the semiconductor device fabricating process comprises a series of sequential steps for forming desired patterns over the surface of semiconductor wafers, and then cleaning the wafer after each process step is completed in order to remove foreign particles and other residue on the surface of the wafer. The cleaning methods typically employ chemical and physical techniques to separate the foreign substances that are attached to the wafer surface.

Since ultra large scale integration (ULSI) technology predominates in the fabrication of semiconductor memory devices, the cleaning steps are increasingly important in removing extremely small particles after forming the minute patterns on the wafer or mask. By decreasing the design rule of the semiconductor memory device to submicron region, the tolerable size of the foreign particles produced during the fabricating process is decreased accordingly. The extremely small foreign particles may cause fatal defects during the fabricating process, thereby decreasing the reliability and yield of the fabrication facility.

However, it is difficult to remove the submicron-sized particles due to a strong adhesion force existing between the particles and the substrate. Some have tried to increase the cleaning efficiency by applying an external force to the particles sought to be removed, with the external force being sufficient to overcome the adhesion force of the particles. An example of such methods, incorporating ultrasonic or megasonic cleaning systems, are disclosed in "Mechanisms of Removal of Micron-Sized Particles by High Frequency Ultrasonic Waves," IEEE Transactions on Ultrasonics, Ferroelectrics and Frequency Control, vol. 42, No. 4, July 1995. Also, U.S. Pat. No. 5,625,249 discloses a megasonic cleaning system including a tank containing cleaning fluid and articles to be cleaned, and piezoelectric transducers attached to the tank for transmitting acoustic energy at a frequency of approximately 1000 kHz into the cleaning tank.

A disadvantage of conventional megasonic cleaning methods is that they are wet methods, typically employing a chemical fluid and deionized water to conduct the cleaning. This results in a decrease in the cleaning efficiency due to the transmission of ultrasonic energy through the chemical medium, which causes particles contained in the chemical fluid to re-contaminate the article or device that is being cleaned. Further, the transmission of ultrasonic energy through the chemical medium may produce minute damages on the mask caused by the flow of the chemicals.

SUMMARY OF THE INVENTION

It is therefore an object of the invention to provide a megasonic cleaning system which can improve cleaning efficiency by applying megasonic energy directly to the articles to be cleaned by blowing off the particles with jets of fluid.

To achieve the above and other objects, the present invention provides a megasonic cleaning system for removing particles attached on a substrate, which includes a transducer for converting electrical energy into acoustical energy. The substrate to be cleaned is placed on top of the transducer. A source of oscillating electrical energy is electrically coupled to the transducer for driving the transducer to produce the acoustical energy at substantially megasonic frequencies. A vacuum source is placed below the substrate in order to vacuum adhere the substrate to the transducer during the operation of the electrical energy oscillating source. A laterally extending blower assembly, configured over the substrate to be cleaned, contains a plurality of nozzles arranged along the length thereof for blowing off the particles with jets of fluid from the nozzles. The blower assembly is arranged such that the flow path through the nozzle is inclined with respect to the surface of the substrate. The blower assembly is incrementally moved linearly over the surface of the substrate to blow the particles off the surface.

Preferably, the transducer is mounted on a vacuum chuck. Also, the width of the portion of the transducer contacting the substrate is reduced as much as possible.

An advantage of the present invention is that it can provide a megasonic cleaning system wherein the megasonic frequency is adjustable such that the frequency of the transducer may be optimized depending on the thickness of the substrate. This allows the megasonic wave passing through the substrate to form a stationary wave from the traveling and reflected waves passing through the substrate, which maximizes the transmission of the megasonic energy to the particles attached on the substrate.

BRIEF DESCRIPTION OF THE DRAWINGS

This invention is described with reference to the accompanying drawings in which.

DETAILED DESCRIPTION OF THE PREFERRED EMBODIMENTS

Figure 1:
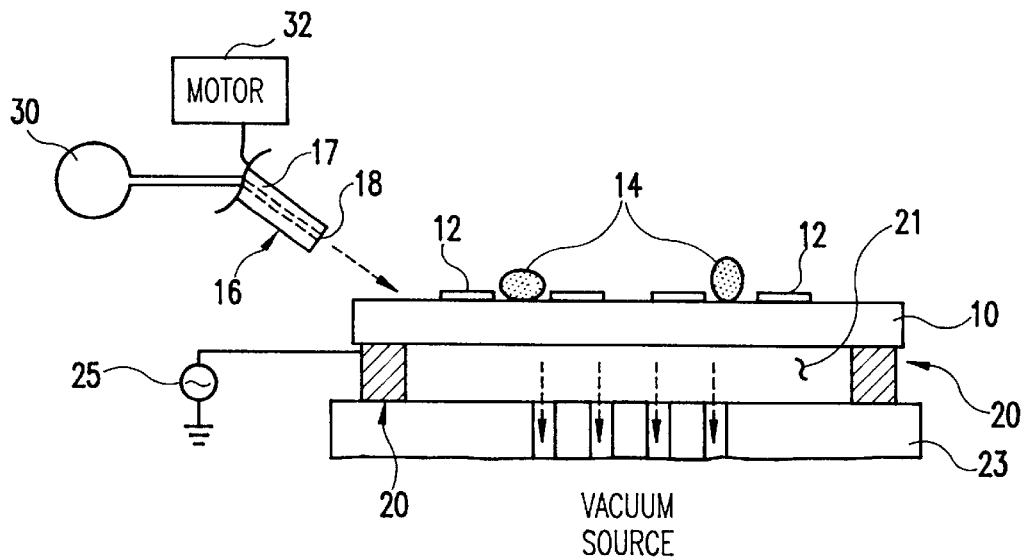
FIG. 1 is a side view, partially in section, of a megasonic cleaning apparatus in accordance with the present invention.

Referring to FIG. 1, the megasonic cleaning apparatus in accordance with the present invention includes a transducer 20 on which an article 10 to be cleaned is placed. In the embodiment illustrated, the article 10 comprises a semiconductor substrate, although the present invention may be utilized for cleaning many types of articles and devices, and is not limited to cleaning just semiconductor substrates. Hereinafter, the article 10 will be referred to as a substrate for simplicity. The substrate 10 may be a semiconductor wafer with desired chromium pattern lines 12 formed thereon through conventional photolithography and etching processes. The illustrated pattern lines 12 are greatly exaggerated for clarity with their actual size being of the submicron level. The contaminating particles 14 attached to the surface of the substrate 10 are also greatly exaggerated for clarity with their actual size being of the submicron level as well.

Figure 2:
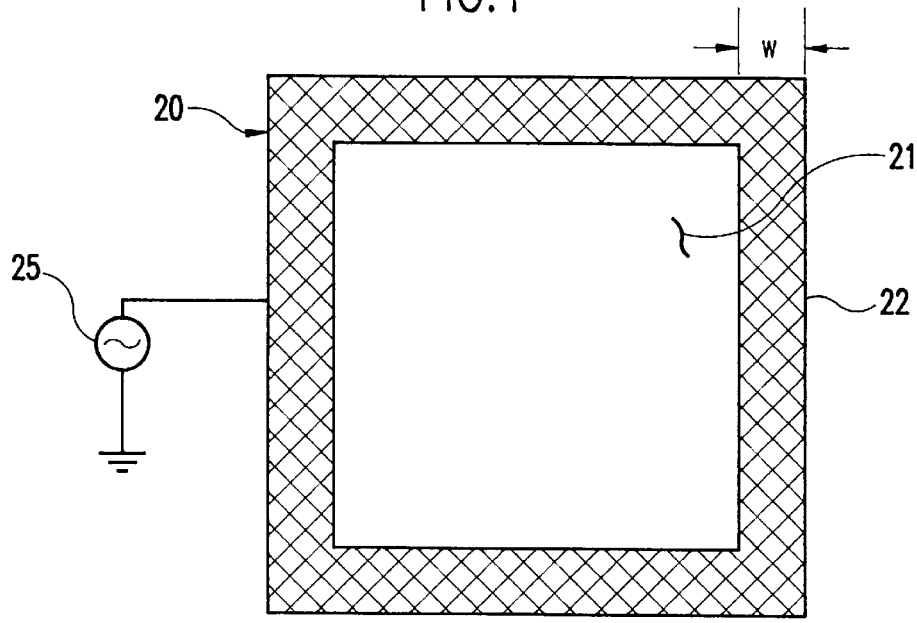
FIG. 2 is a plan view of a piezoelectric transducer used in the megasonic cleaning apparatus of the present invention.

As shown in the plan view in FIG. 2, the transducer 20 comprises a linear strip in the shape of a square surrounding a central opening 21. The transducer 20 consists of a piezoelectric material, and is arranged such that its top portion 22 contacts the bottom portion of the substrate 10. The width "w" of the transducer 20 is preferably reduced as much as possible so that potential physical damage to the bottom surface of the substrate due to the vibration can be minimized or prevented. The transducer 20 is preferably mounted on a vacuum chuck 23 for securing the substrate 10 to the transducer 20 during the cleaning process via a vacuum force in flow communication with the opening 21.

A source of oscillating electrical energy 25 is coupled to the transducer 20 for driving the transducer to produce the acoustical energy at substantially megasonic frequencies, i.e., frequencies greater than 1000 KHz.

Figure 3:
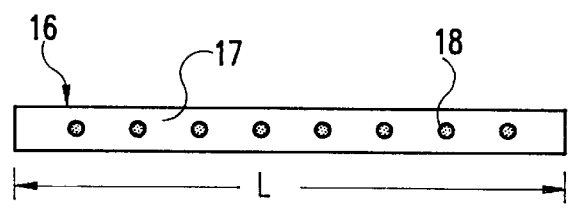
FIG. 3 is an end view of the nozzles in the blower assembly used in the megasonic cleaning apparatus of the present invention.

As shown in FIG. 1 and FIG. 3, a blower assembly 16 having a plurality of nozzles 18 is configured above the substrate 10. The blower assembly 16 comprises a hollow, laterally-extending rod or bar 17 with a set of nozzles 18 arranged laterally along the length of the rod 17, preferably at equal intervals, with the direction of flow through the nozzle 18 being inclined toward the surface of the substrate 10. The nozzles 18 are connected to a fluid source 30. The fluid source may be any type of cleaning liquid or gas.

Preferably, the blower assembly 16 is configured such that it moves horizontally over the surface of the substrate 10 by action of a motor drive unit 32, or other suitable blower driving mechanism. Thus, the nozzles 18 inclined toward the substrate 10 can be incrementally moved over the entire surface of the substrate 10. Preferably, the length "L" of the rod 17 is greater than the lateral dimension of the substrate 10 that it is passing over, such that the fluid flow through the nozzles 18 would extend beyond the lateral dimension of the substrate 10 to ensure complete cleaning.

In operation, when the substrate 10 to be cleaned is placed on the top surface 22 of the transducer 20, the vacuum chuck 23 is operated to hold the substrate 10 onto the top surface 22 of the transducer 20 via an applied vacuum force in flow communication with the opening 21. Note that the top portion 22 of the transducer 20 contacts the bottom surface of the substrate 10, which surface is opposite to the active surface of the substrate 10. Then, electrical energy is provided to the piezoelectric transducer 20 to produce a desired megasonic frequency. The megasonic energy generated in the transducer 20 is transmitted to the substrate 10 so that the substrate 10 vibrates at an extremely small amplitude. This vibration facilitates the separation of the particles 14 from the wafer or mask.

The separated or dislodged particles 14 on the substrate 10 are thereafter removed by the blowing force of the liquid or gas flowing through the nozzles 18. Preferably, the liquid or gas flows through the nozzles 18 under a constant pressure stream. Further, by action of the inclined nozzles 18 spraying a cleaning fluid under constant pressure while incrementally moving over the surface of the substrate 10, any foreign particles on the entire surface area of the substrate 10 can be removed effectively.

Preferably, the frequency of the transducer 20 is optimized depending on the thickness of the substrate 10. This allows the megasonic wave passing through the substrate 10 to form a stationary wave from the traveling and reflected waves passing through the substrate 10, which maximizes the transmission of the megasonic energy to the particles attached on the substrate 10.

As apparent from the foregoing description, the cleaning efficiency of a semiconductor cleaning process can be greatly improved by applying megasonic energy directly to the substrate to dislodge the foreign particles, and then blowing off the particles with jets of liquid or gas. Further, as the megasonic frequency of the transducer is optimized depending on the thickness of the substrate, the transmission efficiency of the ultrasonic energy relative to the substrate and the particles can be maximized. Also, during the cleaning process, since the width of transducer is reduced as much as possible, potential damage to the bottom surface of the substrate due to the vibration can be minimized or prevented.

Although preferred embodiments of the present invention have been described in detail hereinabove, many variations and/or modifications of the basic inventive concepts taught will appear to those skilled in the art. It is thus clear that all such variations and/or modifications fall within the true spirit and scope of the present invention as defined by the appended claims.

What is claimed is:

1. A megasonic cleaning system, comprising:

a transducer on which a substrate to be cleaned is placed;

an oscillating electrical energy source operatively coupled to the transducer for driving the transducer to produce acoustical energy at substantially megasonic frequencies to vibrate the substrate;

a blower assembly arranged over the substrate, the blower assembly comprising a hollow elongate member having a plurality of nozzles spaced along a length of the elongate member;

a source of cleaning fluid in flow communication with the nozzles, wherein a flow path of cleaning fluid through the nozzles is inclined toward an upper surface of the substrate to be cleaned;

a vacuum source in flow communication with the substrate for vacuum-adhering the substrate on the transducer via a vacuum force; and a drive mechanism operatively connected to the blower assembly such that the blower assembly is horizontally movable relative to the upper surface of the substrate, wherein the cleaning fluid flowing through the nozzles is directed toward the upper surface of the substrate to blow away particles that are dislodged by the vibration of the substrate.

2. The megasonic cleaning system of claim 1, wherein the transducer comprises a square-shaped strip of piezoelectric material having a predetermined width surrounding a central opening, and wherein the vacuum source is in flow communication, though the central opening of the transducer, with a bottom surface of the substrate.

3. The megasonic cleaning system of claim 2, further comprising a vacuum chuck on which the transducer is mounted.

4. The megasonic cleaning system of claim 1, wherein the plurality of nozzles are equally spaced along the length of the elongate member.

5. The megasonic cleaning system of claim 4, wherein the length of the elongate member is greater than a lateral dimension of the substrate over which the elongate member is horizontally movable.

6. The megasonic cleaning system of claim 1, wherein megasonic frequency generated in the transducer is adjustable.

7. The megasonic cleaning system of claim 1, wherein the substrate is a semiconductor wafer.

8. The megasonic cleaning system of claim 1, wherein the substrate is a photo mask.

9. The megasonic cleaning system of claim 1, wherein the particles are below submicron size.

10. A megasonic cleaning system, comprising:

a transducer on which a substrate to be cleaned is placed;

an oscillating electrical energy source operatively coupled to the transducer for driving the transducer to produce acoustical energy at substantially megasonic frequencies to vibrate the substrate;

a blower assembly arranged over the substrate, the blower assembly comprising a hollow elongate member having a plurality of nozzles spaced along a length of the elongate member;

a source of cleaning fluid in flow communication with the nozzles, wherein a flow path of cleaning fluid through the nozzles is inclined toward an upper surface of the substrate to be cleaned;

a vacuum source in flow communication with the substrate for vacuum-adhering the substrate on the transducer via a vacuum force; and a drive mechanism operatively connected to the blower assembly such that the blower assembly is horizontally movable relative to the upper surface of the substrate, wherein the cleaning fluid flowing through the nozzles is directed toward the upper surface of the substrate to blow away particles that are dislodged by the vibration of the substrate, wherein the transducer comprises a square-shaped strip of piezoelectric material having a predetermined width surrounding a central opening, and wherein the vacuum source is in flow communication, though the central opening of the transducer, with a bottom surface of the substrate, wherein the plurality of nozzles are equally spaced along the length of the elongate member and the length of the elongate member is greater than a lateral dimension of the substrate over which the elongate member is horizontally movable, and wherein the megasonic frequency generated in the transducer is adjustable.

* * * * *